United States Patent
Yan et al.

(10) Patent No.: US 10,497,563 B2
(45) Date of Patent: Dec. 3, 2019

(54) THIN FILM TRANSISTOR AND METHOD FOR MANUFACTURING THE SAME, ARRAY SUBSTRATE AND METHOD FOR MANUFACTURING THE SAME, DISPLAY PANEL AND DISPLAY DEVICE

(71) Applicants: BOE TECHNOLOGY GROUP CO., LTD., Beijing (CN); South China University of Technology, Guangzhou, Guangdong (CN)

(72) Inventors: Liangchen Yan, Beijing (CN); Guangcai Yuan, Beijing (CN); Xiaoguang Xu, Beijing (CN); Lei Wang, Beijing (CN); Junbiao Peng, Guangdong (CN); Linfeng Lan, Guangdong (CN)

(73) Assignees: BOE TECHNOLOGY GROUP CO., LTD., Beijing (CN); SOUTH CHINA UNIVERSITY OF TECHNOLOGY, Guangzhou, Guangdong (CN)

( * ) Notice: Subject to any disclaimer, the term of this patent is extended or adjusted under 35 U.S.C. 154(b) by 0 days.

(21) Appl. No.: 15/574,154

(22) PCT Filed: Apr. 25, 2017

(86) PCT No.: PCT/CN2017/081858
§ 371 (c)(1),
(2) Date: Nov. 14, 2017

(87) PCT Pub. No.: WO2017/186094
PCT Pub. Date: Nov. 2, 2017

(65) Prior Publication Data
US 2018/0138037 A1    May 17, 2018

(30) Foreign Application Priority Data
Apr. 29, 2016 (CN) .......................... 2016 1 0282800

(51) Int. Cl.
*H01L 21/02* (2006.01)
*H01L 29/786* (2006.01)
(Continued)

(52) U.S. Cl.
CPC .. *H01L 21/02565* (2013.01); *H01L 21/02422* (2013.01); *H01L 21/02628* (2013.01);
(Continued)

(58) Field of Classification Search
None
See application file for complete search history.

(56) References Cited

U.S. PATENT DOCUMENTS

2008/0245266 A1   10/2008  Lewis et al.
2010/0176388 A1   7/2010   Ha et al.
(Continued)

FOREIGN PATENT DOCUMENTS

CN    101580345 A    11/2009
CN    101794819 A    8/2010
(Continued)

OTHER PUBLICATIONS

Tue et al., "High-Performance Solution-Processed ZrInZnO Thin-Film Transistors, IEEE Transactions on Electron Devices", vol. 60(1),p. 320-326 (2013).*
(Continued)

*Primary Examiner* — Asok K Sarkar
(74) *Attorney, Agent, or Firm* — Kinney & Lange, P.A.

(57) ABSTRACT

A method for manufacturing a thin film transistor is disclosed. The method includes: manufacturing a gate electrode, a gate insulation layer, an active layer, a source electrode and a drain electrode on a substrate. The active layer is formed from a zirconium indium oxide semiconductor material by a solution process. A thin film transistor, an array substrate, a method for manufacturing an array (Continued)

substrate, a display panel and a display device are also disclosed.

14 Claims, 6 Drawing Sheets

(51) Int. Cl.
    *H01L 21/84*     (2006.01)
    *H01L 29/24*     (2006.01)
    *H01L 21/443*     (2006.01)
    *H01L 29/66*     (2006.01)
    *H01L 27/12*     (2006.01)
    *G02F 1/1368*     (2006.01)
    *H01L 27/32*     (2006.01)

(52) U.S. Cl.
    CPC ...... *H01L 21/02664* (2013.01); *H01L 21/443* (2013.01); *H01L 21/84* (2013.01); *H01L 27/12* (2013.01); *H01L 29/24* (2013.01); *H01L 29/66969* (2013.01); *H01L 29/786* (2013.01); *H01L 29/7869* (2013.01); *G02F 1/1368* (2013.01); *H01L 27/1225* (2013.01); *H01L 27/3262* (2013.01)

(56) References Cited

U.S. PATENT DOCUMENTS

| | | | |
|---|---|---|---|
| 2012/0146017 A1 | 6/2012 | Kim et al. | |
| 2014/0139772 A1 | 5/2014 | Kim et al. | |
| 2016/0042947 A1* | 2/2016 | Nakamura | H01L 29/66969 257/43 |
| 2017/0077307 A1 | 3/2017 | Yuan et al. | |
| 2017/0352765 A1* | 12/2017 | Imai | G02F 1/1368 |

FOREIGN PATENT DOCUMENTS

| | | | |
|---|---|---|---|
| CN | 102543754 A | 7/2012 | |
| CN | 102610757 A | 7/2012 | |
| CN | 102945828 A | 2/2013 | |
| CN | 103779427 A | 5/2014 | |
| CN | 103839970 A | 6/2014 | |
| CN | 104952914 A | 9/2015 | |
| CN | 105914150 A | 8/2016 | |

OTHER PUBLICATIONS

Xiao et al., "High-mobility ZrIn0 thin-film transistor prepared by an all-DC-sputtering method at room temperature" www.nature.com/scientificreports teaches ZrInO TFT preparation.*
Monoharan, et al., "Structural, Optical and Electrical Properties of Zr-Doped In2O3 Thin Films", SpectroChimica Acta, Part A, Molecular and Biomolecular Spectroscopy, 145 (2015), 47-53.*
International Search Report & Box V of the Written Opinion of the International Searching Authority, for PCT Patent Application No. PCT/CN2017/081858, dated Jul. 20, 2017, 7 pages.
First Chinese Office Action, for Chinese Patent Application No. 201610282800.6, dated Feb. 1, 2018, 17 pages.

* cited by examiner

THIN FILM TRANSISTOR AND METHOD FOR MANUFACTURING THE SAME, ARRAY SUBSTRATE AND METHOD FOR MANUFACTURING THE SAME, DISPLAY PANEL AND DISPLAY DEVICE

CROSS-REFERENCE TO RELATED APPLICATION

This application is a Section 371 National Stage Application of International Application No. PCT/CN2017/081858, filed on Apr. 25, 2017, entitled "THIN FILM TRANSISTOR AND METHOD FOR MANUFACTURING THE SAME, ARRAY SUBSTRATE AND METHOD FOR MANUFACTURING THE SAME, DISPLAY PANEL AND DISPLAY DEVICE", which claims priority to Chinese Patent Application No. 201610282800.6 filed on Apr. 29, 2016 with SIPO, incorporated herein by reference in entirety.

BACKGROUND

Technical Field

Embodiments of the present disclosure relate to a field of display technology, and more particularly, to a thin film transistor, a method for manufacturing a thin film transistor, an array substrate, a method for manufacturing an array substrate, a display panel and a display device.

Description of the Related Art

In recent years, as a size of a display is growing larger and a frequency of a drive circuit is continuously increasing, a mobility of the conventional amorphous silicon thin film transistor cannot meet the actual demand. Since a metal oxide thin film transistor has a high mobility and a good uniformity, more attention has been drawn to it.

At present, a metal oxide thin film transistor in which indium gallium zinc oxide (IGZO for short) is used as an active layer is widely applied. However, the industrialized metal oxide thin film transistors are mainly prepared by a physical vapor deposition (PVD) method, which requires a vacuum equipment to be expensive and is costly. In addition, a utilization of material is extremely low in this method, thereby greatly increasing a production cost.

In contrast, a solution process can achieve processes such as spin coating, dripping coating, printing and roll-to-roll processing, and it is easy to operate, has a high utilization of materials, a lower cost, therefore it has a broader application prospect. However, since a relatively large amount of impurities may be inevitably introduced in the solution process, the mobility of the metal oxide thin film transistor is relatively low. For example, for a metal oxide thin film transistor made of IGZO, if an active layer is prepared by the solution process, its mobility is less than 1 $cm^2/Vs$.

SUMMARY

In a first aspect, there is provided a method for manufacturing a thin film transistor, comprising: manufacturing a gate electrode, a gate insulation layer, an active layer, a source electrode and a drain electrode on a substrate, wherein the active layer is formed from a zirconium indium oxide semiconductor material by a solution process.

Optionally, the number of zirconium atoms accounts for 0.1-20% of the total number of zirconium atoms and indium atoms in the zirconium indium oxide semiconductor material.

Optionally, the step of forming the active layer from the zirconium indium oxide semiconductor material by the solution process comprises: forming the active layer by an ink jet printing process.

Optionally, a solution used for the ink jet printing process is a mixed solution of $In(NO_3)_3 \cdot xH_2O$ and $ZrOCl_2 \cdot xH_2O$ dissolved in ethylene glycol monomethyl ether and ethylene glycol.

Optionally, after forming the active layer and before forming the source electrode and the drain electrode, the method further comprises: forming an etching barrier layer.

Optionally, after forming the active layer and before forming the source electrode and the drain electrode, the method further comprises: forming an etching barrier layer, and a thickness of the etching barrier layer is between 50 nm and 200 nm.

Optionally, after forming the active layer and before forming the source electrode and the drain electrode, the method further comprises: forming an etching barrier layer, and a thickness of the etching barrier layer is between 50 nm and 200 nm, and wherein a solvent in the solution is evaporated by an evaporation process to form the active layer, and the evaporation process is carried out at a temperature of 150° C.~300° C., and a duration of the evaporation process is controlled within 0.5 h~3 h.

Optionally, the substrate is a hard substrate or a flexible substrate.

Optionally, the method further comprises forming a buffer layer on a surface of the substrate, and a thickness of the buffer layer is between 100 nm and 300 nm.

In a second aspect, there is provided a method for manufacturing an array substrate, comprising: forming a thin film transistor and a first electrode electrically connected to a drain electrode of the thin film transistor, wherein the thin film transistor is manufactured by the method according to the first aspect.

Optionally, the first electrode is an anode, the method further comprises: forming a cathode and forming an organic material functional layer between the anode and the cathode; or the first electrode is a pixel electrode.

Optionally, the method further comprises forming a common electrode, and if the array substrate is an In-Plane Switch type of array substrate, the pixel electrode and the common electrode are spaced apart from each other and arranged in a same layer, and the pixel electrode and the common electrode are both strip-shaped electrodes; or if the array substrate is an Advanced-super Dimensional Switching type of array substrate, the pixel electrode and the common electrode are arranged in different layers, the common electrode is a strip-shaped electrode, the pixel electrode is a plate-shaped electrode, and the common electrode is located above the pixel electrode.

In a third aspect, there is provided a thin film transistor, comprising a substrate, a gate electrode, a gate insulation layer, an active layer, a source electrode and a drain electrode; the gate electrode, the gate insulation layer, the active layer, the source electrode and the drain electrode being disposed on the substrate, wherein the active layer is made from a zirconium indium oxide semiconductor material by a solution process. Alternatively, there is provided a thin film transistor manufactured by the method according to the first aspect.

Optionally, the number of zirconium atoms accounts for 0.1-20% of the total number of zirconium atoms and indium atoms in the zirconium indium oxide semiconductor material.

Optionally, the substrate is a hard substrate or a flexible substrate.

In a fourth aspect, there is provided an array substrate, comprising the thin film transistor according to the third aspect and a first electrode electrically connected to the drain electrode of the thin film transistor.

In a fifth aspect, there is provided a display panel, comprising the array substrate according to the fourth aspect.

In a sixth aspect, there is provided a display device, comprising the display panel according to the fifth aspect.

BRIEF DESCRIPTION OF THE DRAWINGS

In order to more clearly illustrate the technical solutions of the embodiments of the present disclosure or the related art, the drawings, which are used in the description of the embodiments or the related art, will be briefly described below. It will be apparent that the drawings in the following description only represent some embodiments of the present disclosure. Other drawings may be obtained by those skilled in the art according to these drawings without creative efforts.

FIG. 5 (b) is a second schematic flowchart of a method for manufacturing a thin film transistor according to an embodiment of the present disclosure;

DETAILED DESCRIPTION OF PREFERRED EMBODIMENTS

The technical solutions in the embodiments of the present disclosure will be clearly and completely described below, with reference to the accompanying drawings in the embodiments of the present disclosure. It will be apparent that the described embodiments only represent a part of the present disclosure, rather than all the embodiments of the present disclosure. All other embodiments obtained by those skilled in the art based on the embodiments of the present disclosure without creative efforts fall within the scope of the present disclosure.

Embodiments of the present disclosure provide a thin film transistor, a method for manufacturing a thin film transistor, an array substrate, a method for manufacturing an array substrate, a display panel and a display device. Within the embodiments of the present disclosure, a metal oxide thin film transistor having a high mobility can be manufactured by a solution process.

Figure 1:
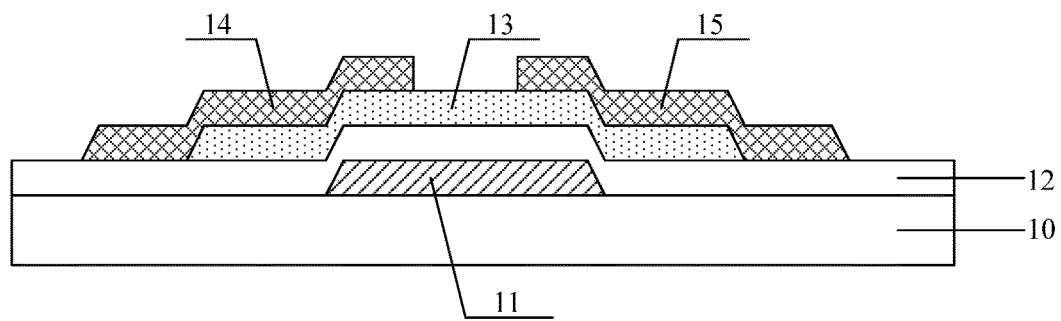
FIG. 1 is a first schematic structural view of a thin film transistor according to an embodiment of the present disclosure.
Figure 2:
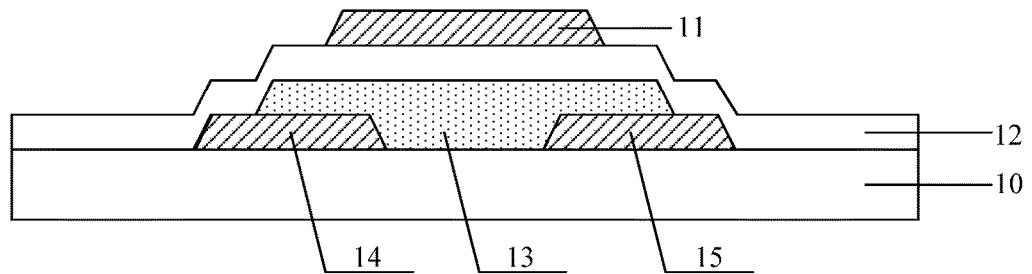
FIG. 2 is a second schematic structural view of a thin film transistor according to an embodiment of the present disclosure.

In order to at least partially achieve the above objectives, the embodiments of the present disclosure provide the following technical solutions:

An embodiment of the present disclosure provide a method for manufacturing a thin film transistor, comprising: manufacturing a gate electrode 11, a gate insulation layer 12, an active layer 13, a source electrode 14 and a drain electrode 15 on a substrate 10, as shown in FIGS. 1 and 2, wherein the active layer 13 is formed from a zirconium indium oxide semiconductor material by a solution process.

The solution process includes processes such as spin coating, dripping coating, printing, etc., and the printing may include an ink jet printing and a transfer printing.

In the embodiment of the present disclosure, the gate electrode 11 may be formed of a single layer of film, or two or more layers of films. If it is formed of a single layer of film, the material may be chosen from a conductive material, such as metal, alloy, conductive metal oxide, doped silicon, conductive polymer, or the like. If it is formed of two or more layers of films, it may be formed by a superposition of two or more layers of films which are made of any combination of the above materials. A thickness of the gate electrode 11 may be between 100 nm and 2000 nm.

The gate insulation layer 12 may be formed of a single layer of film, or two or more layers of films. If it is formed of a single layer of film, the material may be chosen from, for example, silicon dioxide, silicon nitride, silicon oxynitride, alumina, alumina alloy, ytterbium oxide, titanium oxide, hafnium oxide, tantalum oxide, zirconium oxide, polymer insulation material, photoresist or the like. If it is formed of two or more layers of films, it may be formed by a superposition of two or more layers of films which are made of any combination of the above materials. A thickness of the gate insulation layer 12 may be between 50 nm and 500 nm.

The source electrode 14 and the drain electrode 15 may be formed of a single layer of film, or two or more layers of films. If they are formed of a single layer of film, the material may be chosen from conductive material, such as metal, alloy, conductive metal oxide, doped silicon, conductive polymer, or the like. If they are formed of two or more layers of films, they may be formed by a superposition of two or more layers of films which are made of any combination of the above materials. A thickness of the source electrode 14 or the drain electrode 15 may be between 100 nm and 2000 nm.

A thickness of the active layer may be between 10 nm and 100 nm.

It should be noted that, in the embodiment of the present disclosure, the thin film transistor may be of a bottom gate type or a top gate type, or may be of a double gate type. The gate electrode 11, the source electrode 14 and the drain electrode 15 may be formed in a different sequence depending on the type of the thin film transistor.

In the method for manufacturing the thin film transistor according to the embodiments of the present disclosure, the zirconium indium oxide is used as the material of the active layer 13. Since zirconium in the zirconium indium oxide has a function of suppressing oxygen vacancy, it can improve stability. Furthermore, since there is no zinc in the zirconium indium oxide, it can reduce sensitivity to water and oxygen. In addition, the zirconium can generate a donor level substituting for indium, and further it can maintain a carrier concentration, therefore it is possible to avoid a problem of a low mobility during a manufacturing process of the thin film, which is caused by a sharply decreased carrier concentration due to impurity introduced by the solution process. With the present disclosure, a metal oxide thin film transistor having a high mobility can be manufactured and achieved. Since the active layer 13 is made by a solution process, the thin film transistor according to the embodiments of the present disclosure also has advantage of a low production cost.

Optionally, the number of zirconium atoms accounts for 0.1-20% of the total number of zirconium atoms and indium atoms in the zirconium indium oxide semiconductor material, i.e., a ratio of $Zr/(In+Zr)$ is between 0.1% and 20%, or further, specifically accounts for 1-16% of the total number of zirconium atoms and indium atoms in the zirconium indium oxide semiconductor material.

In this way, it is possible to ensure semiconductor performance of the zirconium indium oxide better.

In view of that the ink jet printing process has a higher utilization of material and a higher film forming quality, a material can be directly patterned and the pattern can be achieved in large size in the ink jet printing process, the active layer 13 may be optionally manufactured by the ink jet printing process.

Herein, the material used in the ink jet printing process needs to be dissolved in a solvent to form a solution, so as to implement the printing, and the solvent in the solution is subsequently evaporated by an evaporation process to form the active layer 13.

The evaporation process may be carried out at a temperature of 150° C.~300° C., and the duration can be controlled within 0.5 h~3 h.

Optionally, the solution used for the ink jet printing process is a mixed solution of $In(NO_3)_3 \cdot xH_2O$ (indium nitrate) and $ZrOCl_2 \cdot xH_2O$ (zirconium oxychloride) dissolved in ethylene glycol monomethyl ether and ethylene glycol.

Figure 3:
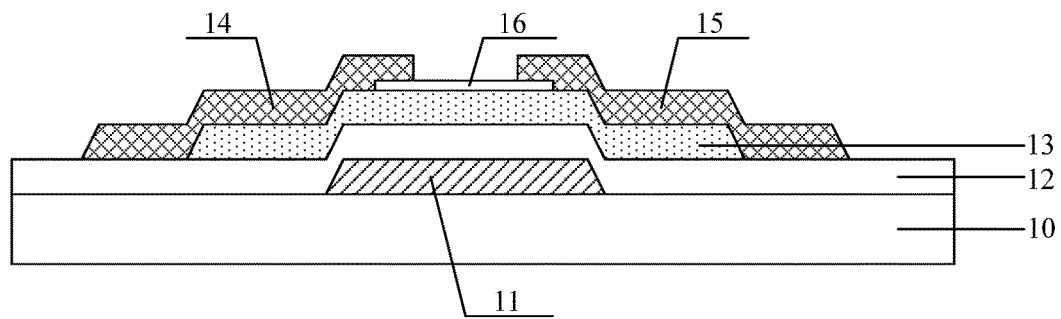
FIG. 3 is a third schematic structural view of a thin film transistor according to an embodiment of the present disclosure.

Optionally, as shown in FIG. 3, after forming the active layer 13 and before forming the source electrode 14 and the drain electrode 15, the method further comprises: forming an etching barrier layer 16.

A thickness of the etching barrier layer 16 may be between 50 nm and 200 nm.

In the embodiment of the present disclosure, the etching barrier layer 16 is formed, on one hand, it can further avoid the zirconium indium oxide from being exposed to air and reacting with oxygen or water; on the other hand, it can avoid from affecting the active layer 13 in the subsequent process of forming the source electrode 14 and the drain electrode 15.

Figure 4A:
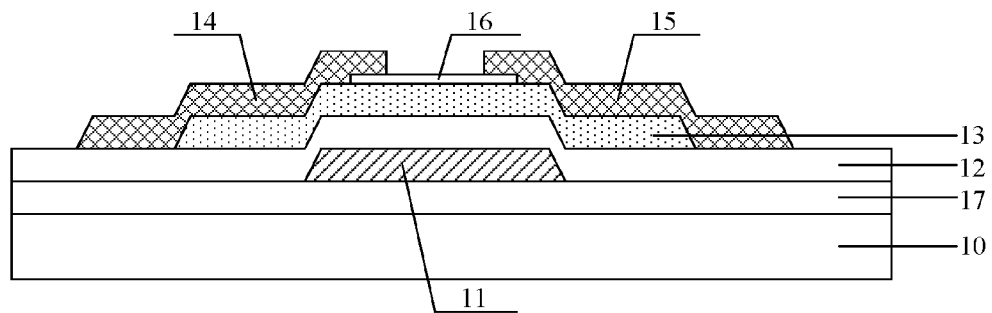
FIG. 4(a) is a fourth schematic structural view of a thin film transistor according to an embodiment of the present disclosure.
Figure 4B:
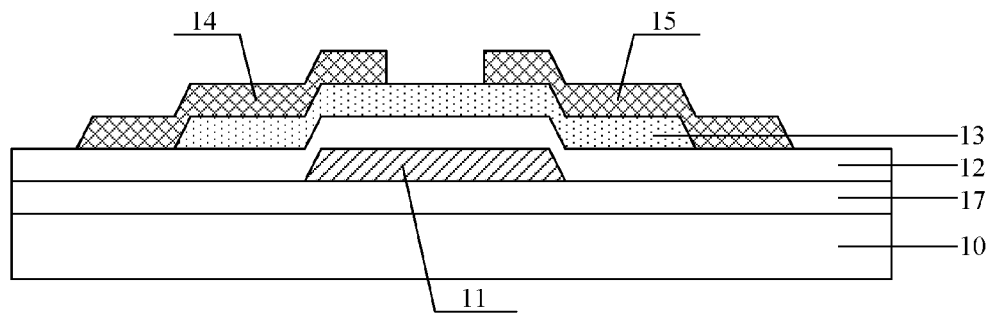
FIG. 4(b) is a fifth schematic structural view of a thin film transistor according to an embodiment of the present disclosure.

Optionally, as shown in FIGS. 4 (*a*) and 4 (*b*), the manufacturing method further comprises forming a buffer layer 17 on a surface of the substrate 10. In this way, it can avoid from a poor film forming quality due to an introduction of impurities from the substrate 10 into the active layer 13 or an unevenness of the substrate itself, thereby ensuring the performance of the thin film transistor.

A thickness of the buffer layer 17 may be between 100 nm and 300 nm.

Next, two specific embodiments are provided to describe the method for manufacturing the thin film transistor described above in detail, and the performance of the thin film transistor is illustrated by experimental data.

Figure 5A:
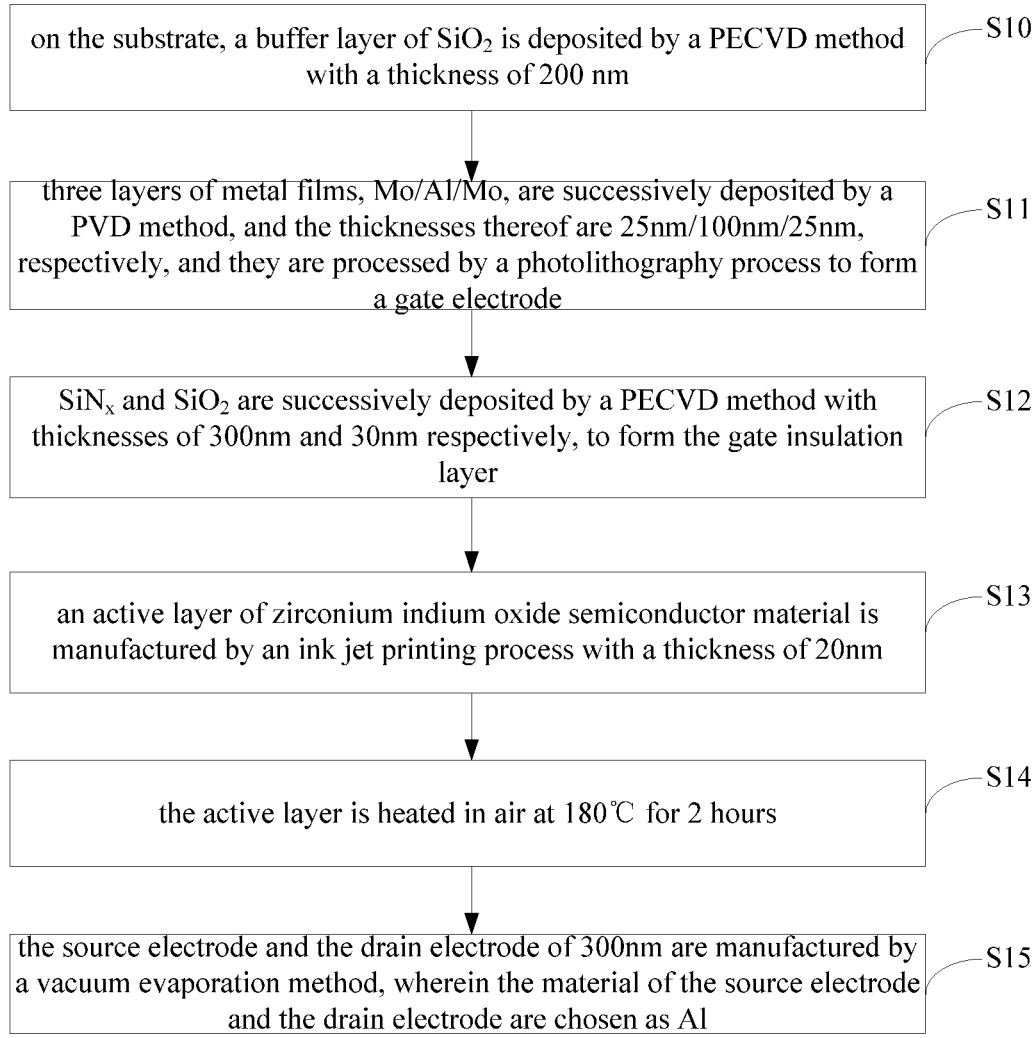
FIG. 5 (a) is a first schematic flowchart of a method for manufacturing a thin film transistor according to an embodiment of the present disclosure.
Figure 5B:
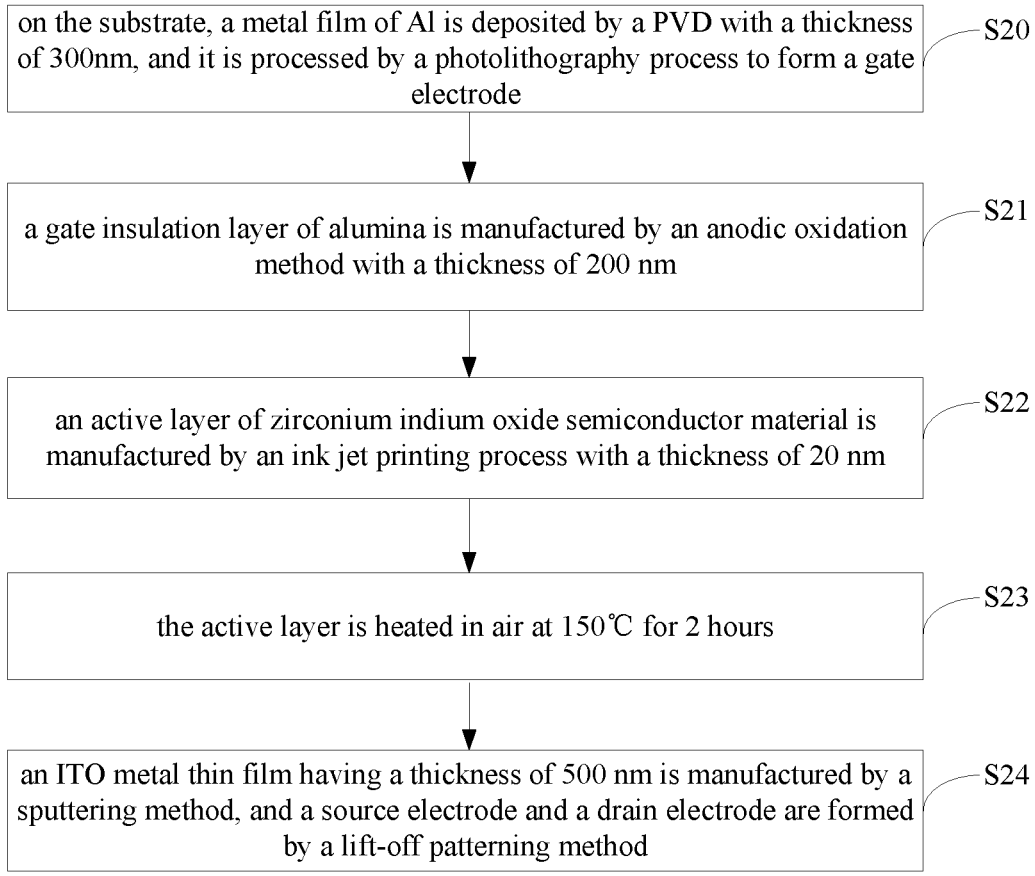

In an embodiment, there is provided a method for manufacturing a thin film transistor as shown in FIG. 4 (*b*), comprising the steps of (as shown in FIG. 5 (*a*)):

S10: on the substrate 10, a buffer layer 17 of $SiO_2$ (silicon dioxide) is deposited by a plasma enhanced chemical vapor deposition (PECVD) method with a thickness of 200 nm.

The substrate 10 may be an alkali-free glass.

S11: on the basis of S10, three layers of metal films, Mo (molybdenum)/Al (aluminum)/Mo, are successively deposited by a PVD method, and the thicknesses thereof are 25 nm/100 nm/25 nm, respectively, and they are processed by a photolithography process to form a gate electrode 11.

S12: on the basis of S11, $SiN_x$ (silicon nitride) and $SiO_2$ are successively deposited by a PECVD method with thicknesses of 300 nm and 30 nm respectively, to form the gate insulation layer 12.

S13: on the basis of S12, an active layer 13 of zirconium indium oxide semiconductor material is manufactured by an ink jet printing process with a thickness of 20 nm.

A solution used for the ink jet printing process is a mixed solution of $In(NO_3)_3 \cdot xH_2O$ and $ZrOCl_2 \cdot xH_2O$ dissolved in ethylene glycol monomethyl ether and ethylene glycol.

A percentage of the number of zirconium atoms in the total number of zirconium atoms and indium atoms in the zirconium indium oxide semiconductor material, i.e., a ratio of $[Zr/(In+Zr)]$ may be 1%, 6%, 11%, or 16%.

S14: on the basis of S13, the active layer is heated in air at 180° C. for 2 hours.

S15: on the basis of S14, the source electrode 14 and the drain electrode 15 of 300 nm are manufactured by a vacuum evaporation method, wherein the material of the source electrode 14 and the drain electrode 15 are chosen as Al.

Alternatively, the source electrode 14 and the drain electrode 15 may be manufactured by a printing process.

Figure 6:
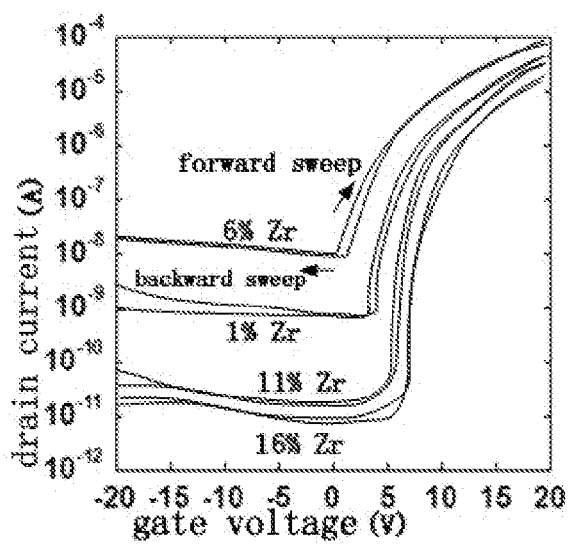
FIG. 6 is a first transfer characteristic curve of a manufactured thin film transistor according to an embodiment of the present disclosure.

As shown in FIG. 6, it shows a transfer characteristic curve of the metal oxide thin film transistor manufactured through S10-S15, which is measured in air, that is, a relationship between a drain current and a gate voltage. The test is carried out under a condition that a source voltage ($V_s$) is 0V, a drain voltage ($V_D$) is constantly 20V, a gate voltage ($V_G$) firstly changes from −20V to 20V to implement a forward sweep, and then changes from 20V to −20V to implement a backward sweep. Under this condition, a drain current ($I_D$) is measured. It can be seen that the thin film transistor having an active layer formed of zirconium indium oxide by a solution process has an excellent performance, the mobility thereof is greatly increased and the drain current is also relatively low.

The following table shows parameters of the metal oxide thin film transistor manufactured through S10-S15. It can be seen that, when Zr content is relatively small, electron surplus takes a dominant position due to the substitution of Zr for In, at this time the mobility is higher and off-state current is larger. When the Zr content reaches 11%, the off-state current is significantly reduced. At this time, although the mobility is also reduced, it still meets the mobility requirements, and a magnetic hysteresis effect between the forward sweep and the backward sweep is also reduced, indicating that the function of suppressing oxygen vacancy by Zr begins to take the dominant position.

| Zr/(In + Zr) | 1% | 6% | 11% | 16% |
|---|---|---|---|---|
| mobility (cm$^2$/Vs) | 19.6 | 25.3 | 11.2 | 7.1 |
| magnetic hysteresis effect (V) | 1.0 | 1.2 | 0.4 | 0.4 |
| off-state current (A) | $1 \times 10^{-9}$ | $1 \times 10^{-8}$ | $5 \times 10^{-10}$ | $1 \times 10^{-11}$ |

In another embodiment, there is provided a method for manufacturing a thin film transistor as shown in FIG. 1, comprising the steps of (as shown in FIG. 5 (b)):

S20: on the substrate 10, a metal film of Al (aluminum) is deposited by a PVD with a thickness of 300 nm, and it is processed by a photolithography process to form a gate electrode 11.

The substrate 10 may be a flexible substrate of polyethylene naphthalate (PEN).

S21: on the basis of S20, a gate insulation layer 12 of alumina is manufactured by an anodic oxidation method with a thickness of 200 nm.

S22: on the basis of S21, an active layer 13 of zirconium indium oxide semiconductor material is manufactured by an ink jet printing process with a thickness of 20 nm.

A solution used for the ink jet printing process is a mixed solution of $In(NO_3)_3 \cdot xH_2O$ and $ZrOCl_2 \cdot xH_2O$ dissolved in ethylene glycol monomethyl ether and ethylene glycol.

A percentage of the number of zirconium atoms in the total number of zirconium atoms and indium atoms, i.e., a ratio of [Zr/(In+Zr)] in the zirconium indium oxide semiconductor material may be 12%.

S23: on the basis of S22, the active layer is heated in air at 150° C. for 2 hours.

S24: on the basis of S23, an ITO (indium tin oxide) metal thin film having a thickness of 500 nm is manufactured by a sputtering method, and a source electrode 14 and a drain electrode 15 are formed by a lift-off patterning method.

Figure 7:
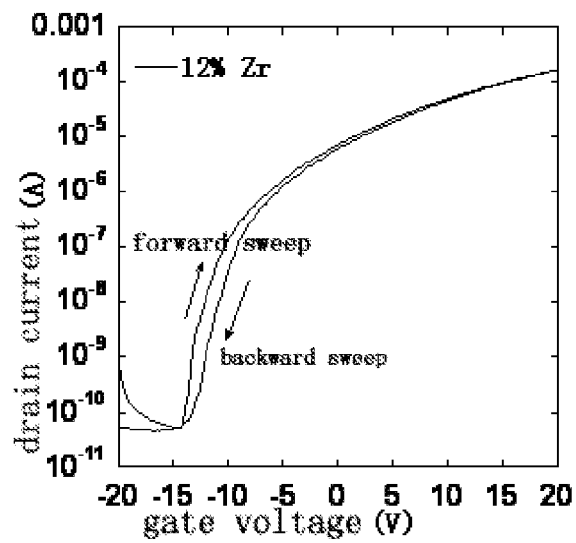
FIG. 7 is a second transfer characteristic curve of a manufactured thin film transistor according to an embodiment of the present disclosure.

As shown in FIG. 7, it shows a transfer characteristic curve of the metal oxide thin film transistor manufactured through S20-S24, which is measured in air, that is, a relationship between a drain current and a gate voltage. The test is carried out under a condition that a source voltage (Vs) is 0V, a drain voltage ($V_D$) is constantly 20V, a gate voltage ($V_G$) firstly changes from −20V to 20V to implement a forward sweep, and then changes from 20V to −20V to implement a backward sweep. Under this condition, a drain current ($I_D$) is measured. It can be seen that the thin film transistor having an active layer formed of zirconium indium oxide by a solution process has an excellent performance, the mobility thereof is greatly increased and the drain current is also relatively low.

The mobility of the manufactured thin film transistor is 9.8 cm$^2$/Vs, which satisfies the requirement that the mobility of the thin film transistor is greater than 5 cm$^2$/Vs, indicating that the metal oxide thin film transistor manufactured in the embodiment of the present disclosure has a high mobility even in the case where an annealing temperature is low, thus it can be compatible with a flexible substrate.

That is to say, the substrate 10 of the thin film transistor according to the embodiment of the present disclosure may be a hard substrate or a flexible substrate. The hard substrate is made of for example glass, silicon wafer, metal foil, quartz, or the like. The flexible substrate may be made of for example PEN, PET (polyethylene terephthalate), PI (polyimide), PC (polycarbonate), PEI (polyetherimide), or the like.

An embodiment of the present disclosure also provides a method for manufacturing an array substrate in which a thin film transistor may be formed by the above-described method and a first electrode is formed.

Figure 8:
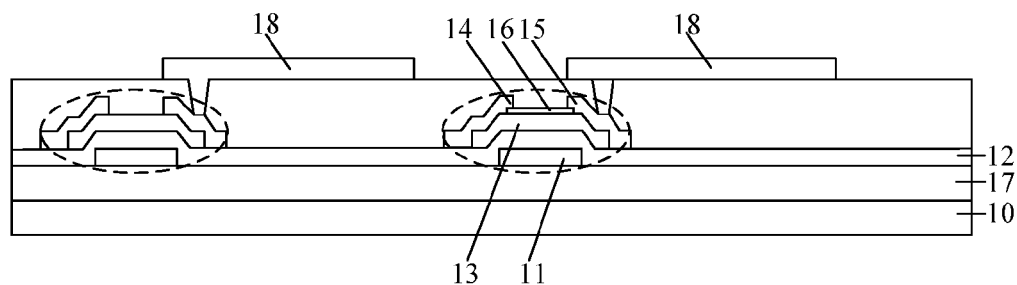
FIG. 8 is a first schematic structural view of an array substrate according to an embodiment of the present disclosure.

The array substrate may be used for an LCD (liquid crystal display). Based on this, the first electrode may be a pixel electrode 18, as shown in FIG. 8.

Figure 9:
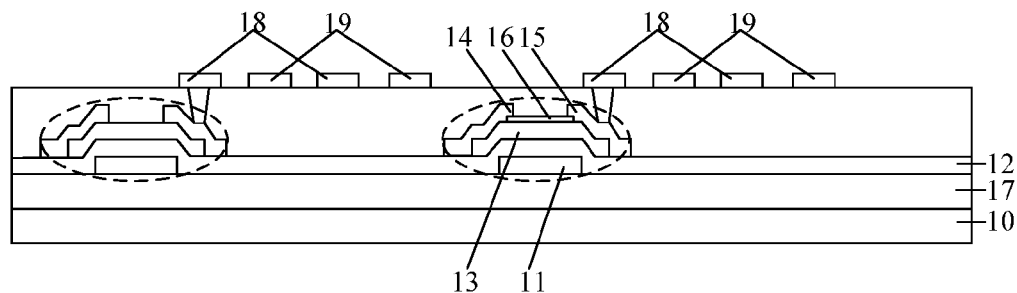
FIG. 9 is a second schematic structural view of an array substrate according to an embodiment of the present disclosure.
Figure 10:
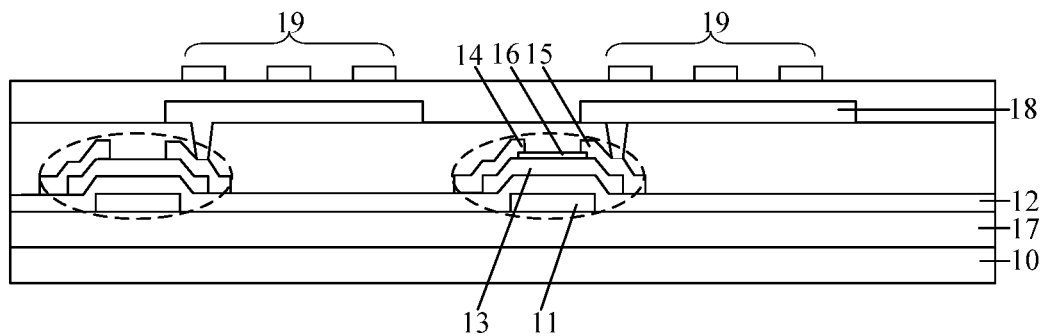
FIG. 10 is a third schematic structural view of an array substrate according to an embodiment of the present disclosure.

On the basis of this, the method for manufacturing the array substrate further comprises: forming a common electrode 19. In this case, for an IPS (In-Plane Switch) type of array substrate, as shown in FIG. 9, the pixel electrode 18 and the common electrode 19 are spaced apart from each other and arranged in the same layer, and they are both strip-shaped electrodes. For an ADS (Advanced-super Dimensional Switching) type of array substrate, as shown in FIG. 10, the pixel electrode 18 and the common electrode 19 are arranged in different layers, wherein the upper electrode is a strip-shaped electrode, and the lower electrode is a plate-shaped electrode, the upper strip-shaped electrode is the common electrode 19 and the lower plate-shaped electrode is the pixel electrode 18. Alternatively, in an embodiment, the pixel electrode 18 may be located above the common electrode 19.

Figure 11:
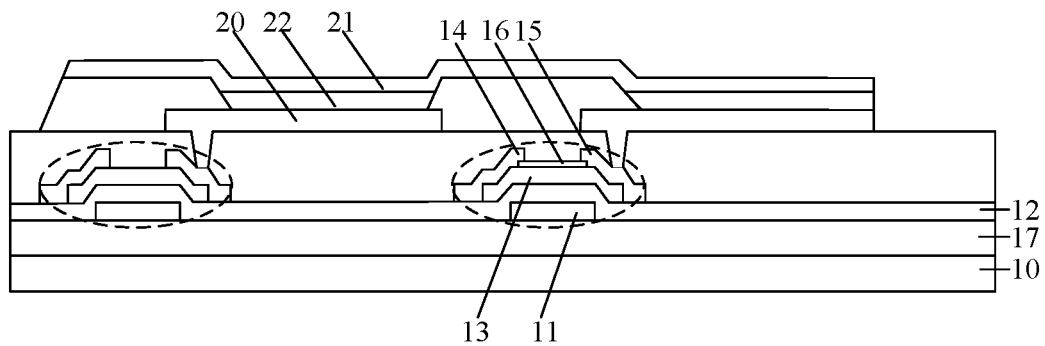
FIG. 11 is a fourth schematic structural view of an array substrate according to an embodiment of the present disclosure.

Of course, the array substrate can also be used for an AMOLED (Active Matrix/Organic Light Emitting Diode) display. Based on this, as shown in FIG. 11, the first electrode may be an anode 20. On the basis of this, the method for manufacturing the array substrate further comprises: forming a cathode 21 and forming an organic material functional layer 22 between the anode 20 and the cathode 21.

The organic material functional layer 22 may include at least a light emitting layer, and may further include an electron transport layer and a hole transport layer. On the basis of this, in order to improve efficiency of injection of electron and hole into the light emitting layer, the organic material functional layer 22 may further include an electron injection layer formed between the cathode 21 and the electron transport layer and a hole injection layer formed between the anode 20 and the hole transport layer.

Specifically, depending on the material of the anode 20 and the cathode 21, it can be divided into a single-sided light-emitting type of OLED array substrate and a double-sided light-emitting type of OLED array substrate; that is, if the material of one of the anode 20 and the cathode 21 is opaque, the OLED array substrate is of a single-sided light-emitting type; if the materials of the anode 20 and the cathode 21 both are transparent, the OLED array substrate is of a double-sided light-emitting type.

The single-sided light-emitting type of OLED array substrate may be divided into an upper light-emitting type of OLED array substrate and a lower light-emitting type of OLED array substrate, depending on the materials of the anode 20 and the cathode 21. Specifically, if the anode 20 is disposed close to the substrate, the cathode 21 is disposed away from the substrate, and the anode 20 is made from a transparent conductive material and the cathode 21 is made from an opaque conductive material, the light passes through the anode 20 and the substrate and finally at a side of the substrate, therefore it may be referred to as a lower light-emitting type of OLED array substrate. If the anode 20 is made from an opaque conductive material and the cathode 21 is made from a transparent conductive material, the light is emitted from a side where the cathode 21 is located, therefore it may be referred to as an upper light-emitting type of OLED array substrate. Of course, relative positions of the above-described anode 20 and cathode 21 may be exchanged, which will not be described again.

An embodiment of the present disclosure also provides a thin film transistor comprising, as shown in FIGS. 1 and 2, a substrate 10, a gate electrode 11, a gate insulation layer 12, an active layer 13, a source electrode 14, a drain electrode 15; the gate electrode, the gate insulation layer, the active layer, the source electrode and the drain electrode being disposed on the substrate, wherein the active layer 13 is made from a zirconium indium oxide semiconductor material.

In the embodiment of the present disclosure, the gate electrode 11 may be formed of a single layer of film, or two or more layers of films. If it is formed of a single layer of film, the material may be chosen from a conductive material, such as metal, alloy, conductive metal oxide, doped silicon, conductive polymer, or the like. If it is formed of two or more layers of films, it may be formed by a superposition of two or more layers of films which are made of any combination of the above materials. A thickness of the gate electrode 11 may be between 100 nm and 2000 nm.

The gate insulation layer 12 may be formed of a single layer of film, or two or more layers of films. If it is formed of a single layer of film, the material may be chosen from, for example, silicon dioxide, silicon nitride, silicon oxynitride, alumina, alumina alloy, ytterbium oxide, titanium oxide, hafnium oxide, tantalum oxide, zirconium oxide, polymer insulation material, photoresist or the like. If it is formed of two or more layers of films, it may be formed by a superposition of two or more layers of films which are made of any combination of the above materials. A thickness of the gate insulation layer 12 may be between 50 nm and 500 nm.

The source electrode 14 and the drain electrode 15 may be formed of a single layer of film, or two or more layers of films. If they are formed of a single layer of film, the material may be chosen from conductive material, such as metal, alloy, conductive metal oxide, doped silicon, conductive polymer, or the like. If they are formed of two or more layers of films, they may be formed by a superposition of two or more layers of films which are made of any combination of the above materials. A thickness of the source electrode 14 or the drain electrode 15 may be between 100 nm and 2000 nm.

A thickness of the active layer may be between 10 nm and 100 nm.

It should be noted that, in the embodiment of the present disclosure, the thin film transistor may be of a bottom gate type or a top gate type, or may be of a double gate type. The gate electrode 11, the source electrode 14 and the drain electrode 15 may be formed in a different sequence depending on the type of the thin film transistor.

In the thin film transistor according to the embodiments of the present disclosure, the zirconium indium oxide is used as the material of the active layer 13. Since zirconium in the zirconium indium oxide has a function of suppressing oxygen vacancy, it can improve stability. Furthermore, since there is no zinc in the zirconium indium oxide, it can reduce sensitivity to water and oxygen. In addition, the zirconium can generate a donor level substituting for indium, and further it can maintain a carrier concentration, therefore it is possible to avoid a problem of a low mobility during a manufacturing process of the thin film, which is caused by a sharply decreased carrier concentration due to impurity introduced by the solution process. Through the present disclosure, a metal oxide thin film transistor having a high mobility can be manufactured and achieved. Since the active layer 13 is made by a solution process, the metal oxide thin film transistor according to the embodiments of the present disclosure also has characteristic of a low production cost.

Optionally, the number of zirconium atoms accounts for 0.1-20% of the total number of zirconium atoms and indium atoms in the zirconium indium oxide semiconductor material, i.e., a ratio of Zr/(In+Zr) is between 0.1% and 20%, or further, in one example accounts for 1-16% of the total number of zirconium atoms and indium atoms in the zirconium indium oxide semiconductor material.

In this way, it is possible to ensure semiconductor performance of the zirconium indium oxide.

Optionally, as shown in FIG. 3, the thin film transistor further comprises an etching barrier layer 16 disposed between the active layer 13 and the source electrode 14 or the drain electrode 15.

A thickness of the etching barrier layer 16 may be between 50 nm and 200 nm.

In the embodiment of the present disclosure, the etching barrier layer 16 is formed, on one hand, it can further avoid the zirconium indium oxide from being exposed to air and reacting with oxygen or water; and on the other hand, it can avoid from affecting the active layer 13 in the subsequent process of forming the source electrode 14 and the drain electrode 15.

Optionally, as shown in FIGS. 4 (*a*) and 4 (*b*), the thin film transistor further comprises a buffer layer 17 disposed on a surface of the substrate 10. In this way, it can avoid from a poor film forming quality due to an introduction of impurities from the substrate 10 into the active layer 13 or an unevenness of the substrate itself, thereby ensuring the performance of the thin film transistor.

A thickness of the buffer layer 17 may be between 100 nm and 300 nm.

On the basis of the above, the substrate 10 may be a hard substrate or a flexible substrate. The hard substrate is made of for example glass, silicon wafer, metal foil, quartz, or the like. The flexible substrate may be made of for example PEN, PET, PI, PC, PEI, or the like.

An embodiment of the present disclosure also provides an array substrate, comprising the above-described thin film transistor and a first electrode electrically connected to the drain electrode of the thin film transistor.

The array substrate may be used for an LCD. Based on this, the first electrode may be a pixel electrode 18, as shown in FIG. 8.

On the basis of this, as shown in FIGS. 9 and 10, the array substrate further includes a common electrode 19.

Of course, the array substrate can also be used for an AMOLED display. Based on this, as shown in FIG. 11, the first electrode may be an anode 20. On the basis of this, the array substrate further comprises: a cathode 21 and an organic material functional layer 22 between the anode 20 and the cathode 21.

An embodiment of the present disclosure also provides a display panel, comprising the above-described array substrate.

If the first electrode is a pixel electrode 18, the display panel further includes a substrate to be assembled.

If the first electrode is an anode 20, the display panel further includes a package substrate.

An embodiment of the present disclosure also provides a display device, comprising the above-described display panel.

The display device may be an LCD or an OLED display device.

The above-described embodiments only represent specific embodiments of the present disclosure, but the scope of the present disclosure is not limited thereto. Any variations or substitutions made to the present disclosure by those skilled in the art fall within the scope of the present disclosure. Accordingly, the scope of the present disclosure is defined by the appending claims.

What is claimed is:

1. A method for manufacturing a thin film transistor, comprising:
   manufacturing a gate electrode, a gate insulation layer, an active layer, a source electrode and a drain electrode on a substrate,
   wherein the active layer is formed from a zirconium indium oxide semiconductor material by a solution process, and there is no zinc in the zirconium indium oxide semiconductor material,
   wherein a solvent is evaporated by an evaporation process to form the active layer,
   wherein a number of zirconium atoms accounts for 1-16% of a total number of zirconium atoms and indium atoms in the zirconium indium oxide semiconductor material,
   wherein forming the active layer from the zirconium indium oxide semiconductor material by the solution process comprises: forming the active layer by an ink jet printing process, and
   wherein a solution used for the ink jet printing process is a mixed solution of $In(NO_3)_3 \cdot xH_2O$ and $ZrOCL_2 \cdot xH_2O$ dissolved in ethylene glycol monomethyl ether and ethylene glycol.

2. The method according to claim 1, wherein after forming the active layer and before forming the source electrode and the drain electrode, the method further comprises:
   forming an etching barrier layer.

3. The method according to claim 1, wherein the substrate is a hard substrate or a flexible substrate.

4. A method for manufacturing an array substrate, comprising:
   forming a thin film transistor and a first electrode electrically connected to a drain electrode of the thin film transistor,
   wherein the thin film transistor is manufactured by the method according to claim 1.

5. The method according to claim 4, wherein:
   the first electrode is an anode, and the method further comprises forming a cathode and forming an organic material functional layer between the anode and the cathode; or
   wherein the first electrode is a pixel electrode.

6. The method according to claim 5, wherein the method further comprises forming a common electrode, and:
   the array substrate is an In-Plane Switch type of array substrate, the pixel electrode and the common electrode are spaced apart from each other and arranged in a same layer, and the pixel electrode and the common electrode are both strip-shaped electrodes; or
   the array substrate is an Advanced-super Dimensional Switching type of array substrate, the pixel electrode and the common electrode are arranged in different layers, the common electrode is a strip-shaped electrode, the pixel electrode is a plate-shaped electrode, and the common electrode is located above the pixel electrode.

7. A thin film transistor manufactured by the method according to claim 1.

8. The thin film transistor according to claim 7, wherein the substrate is a hard substrate or a flexible substrate.

9. An array substrate, comprising the thin film transistor according to claim 7 and a first electrode electrically connected to the drain electrode of the thin film transistor.

10. A display panel, comprising the array substrate according to claim 9.

11. A display device, comprising the display panel according to claim 10.

12. The method according to claim 1, wherein after forming the active layer and before forming the source electrode and the drain electrode, the method further comprises: forming an etching barrier layer, a thickness of the etching barrier layer being between 50 nm and 200 nm.

13. The method according to claim 1, wherein after forming the active layer and before forming the source electrode and the drain electrode, the method further comprises: forming an etching barrier layer, a thickness of the etching barrier layer being between 50 nm and 200 nm, and
   wherein the evaporation process is carried out at a temperature of 150° C.–300° C., and a duration of the evaporation process is controlled within 0.5 h~3 h.

14. The method according to claim 1, wherein the method further comprises forming a buffer layer on a surface of the substrate, a thickness of the buffer layer being between 100 nm and 300 nm.

* * * * *